United States Patent [19]

Takahashi

[11] Patent Number: 4,846,927

[45] Date of Patent: Jul. 11, 1989

[54] CZOCHRALSKI METHOD FOR SINGLE CRYSTAL GROWING OF A COMPOUND SEMICONDUCTOR

[75] Inventor: Toru Takahashi, Fukushima, Japan

[73] Assignee: Shin-Etsu Handotai Co., Ltd., Tokyo, Japan

[21] Appl. No.: 43,848

[22] Filed: Apr. 29, 1987

[30] Foreign Application Priority Data

May 1, 1986 [JP] Japan .................................. 61-101383

[51] Int. Cl.$^4$ .............................................. C30B 27/02
[52] U.S. Cl. ............................... 156/618.1; 156/620.2; 156/607; 156/605; 156/DIG. 70
[58] Field of Search ................. 156/605, 616, 617 SP, 156/607, DIG. 70, 617.1, 618.1, 620.2, 616.1

[56] References Cited

U.S. PATENT DOCUMENTS

| | | | |
|---|---|---|---|
| 3,951,729 | 4/1976 | Takagi et al. | 156/617 SP |
| 4,303,464 | 12/1981 | Suzuki et al. | 156/617 SP |
| 4,584,174 | 4/1986 | Morioka et al. | 148/33 |
| 4,594,173 | 6/1986 | Hobgood et al. | 156/605 |
| 4,618,396 | 10/1986 | Shimoda et al. | 156/605 |

FOREIGN PATENT DOCUMENTS

| | | | |
|---|---|---|---|
| 3514294 | 10/1985 | Fed. Rep. of Germany | 156/605 |
| 2021791 | 1/1987 | Japan | 156/605 |

OTHER PUBLICATIONS

Ghandi, S., "VSLI Fabrication Principles", 1983, Wiley & Sons, p. 98.
Jacob et al., "Dislocation-Free GaAs and InP Crystals By Isoelectronic Doping", J. Crys. Growth 61 (1983) 417-424.
Ono et al., "Cellular Growth and In-Concentrated Inclusions in LEC In-Doped GaAs Crystals", J. Crys. Growth 74(1986) 446-452.
Yamada et al., "Elimination of Grown-in Dislocations in In-Doped Liquid Encapsulated Czochralski GaAs", J. Crys. Growth 78(1986) 36-42.
Brice, J., "Crystal Growth Processes", Blackie and Wiley and Sons, 1986 pp. 129-136, 144-149.
Brice, J., "The Growth of Crystals from Liquids", North Holland, 1973, pp. 247-255.

Primary Examiner—John Doll
Assistant Examiner—R. Bruce Breneman
Attorney, Agent, or Firm—Jules E. Goldberg

[57] ABSTRACT

The invention provides a method of high productivity for the preparation of a substantially dislocation-free single crystal of a compound semiconductor such as gallium arsenide by the liquid-encapsulated Czochralski method. The improvement provided by the invention comprises admixing the melt in the crucible with an additive having an equilibrium segregation coefficient $K_O$ smaller than 1.0, which is indium in the preparation of gallium arsenide single crystals, in a concentration of at least $1.0 \times 10^{21}$ atoms/cm$^3$ of the melt and rotating the crucible at an unusually high velocity of at least 40 rpm.

2 Claims, No Drawings

CZOCHRALSKI METHOD FOR SINGLE CRYSTAL GROWING OF A COMPOUND SEMICONDUCTOR

BACKGROUND OF THE INVENTION

The present invention relates to a liquid-encapsulated Czochralski method for single crystal growing of a compound semiconductor or, more particularly, to a liquid-encapsulated Czochralski (LEC) method for growing a single crystal of a compound semiconductor which is substantially free from dislocations and undesirable crystalline lattice defects of other types.

As is well known, single crystals of III-V Group compound semiconductors such as gallium arsenide GaAs are widely used as a material of high-performance electronic components such as high-speed discrete devices, high-speed integrated circuits and the like by virtue of the remarkably large electron mobility therein. A problem in such high-performance devices and integrated circuits is that the semiconductor substrate thereof must be prepared from a dislocation-free single crystal of which the electric properties are uniform to an extremely small microscopic dimension. In this regard, extensive investigations have been undertaken by the LEC method but no successful results have hitherto been reported that a dislocation-free undoped single crystal can be obtained. The best of the methods known at present and the most widely utilized method at present is to admix the melt of gallium arsenide with indium in a relatively minor amount so that the single crystal grown from the melt is imparted with increased strengths along with consequent prevention of occurrence of dislocations in the bulk as is reported in Journal of Crystal Growth, volume 61 (1983), pages 417–424.

In the above mentioned method, occurrence of dislocations can be prevented by increasing the amount of indium added to the melt of gallium arsenide. According to this technology, a single crystal of gallium arsenide having a large diameter but substantially free from dislocations can be grown only when the concentration of indium is considerably high in the melt of gallium arsenide.

When the additive added to the melt has an equilibrium segregation coefficient $K_o$ smaller than 1, as is the case with indium in gallium arsenide, however, the concentration of the additive in the melt left in the crucible is steadily increased as the single crystal growing proceeds and constitutional supercooling at the interface of the growing front of the single crystal and the melt may eventually cause cellular growth. The above mentioned scientific journal article reports that, in such a case, a large number of dislocations are produced in the single crystal or, in some extreme cases, no single crystal can be obtained but what is grown up is a polycrystalline material.

This problem can of course be solved by performing the liquid-encapsulated Czochralski crystal growing at an extremely low velocity of pulling up. For example, the velocity of pulling up should be 1.0 mm/hour or lower in a high solidification range where the solidification is defined as the ratio of the weight of the single crystal under proceeding growing to the total amount of the melt formed in the crucible at the start of crystal growing including the additives. Such a method is of course not practical due to the extremely low productivity or high costs.

On the other hand, it is also desirable that the process of crystal growing is carried out until the extent of solidification is as high as possible while the undesirable phenomenon of cellular growth sometimes takes place in the latest stage of such a crystal growing process.

SUMMARY OF THE INVENTION

The present invention therefore has an object to provide an improved Czochralski method for single crystal growing of a compound semiconductor by the liquid-encapsulation method, in which a substantially dislocation-free single crystal can easily be obtained without the above described problems and disadvantages in the prior art methods.

Thus, the present invention provides an improvement which comprises, in a liquid-encapsulated Czochralski single crystal growing method for the preparation of a substantially dislocation-free single crystal of a compound semiconductor from a melt of the same compound semiconductor, admixing the melt with an additive having an equilibrium segregation coefficient $K_o$ smaller than 1.0 in such an amount that the concentration of the additive in the melt is at least $1.0 \times 10^{21}$ atoms/cm$^3$ and rotating the crucible containing the melt at a relatively high velocity of, for example, at least 40 rpm.

DETAILED DESCRIPTION OF THE PREFERRED EMBODIMENTS

As is understood from the above given summary of the invention, the characteristic features of the inventive methods consist in admixing the melt of the compound semiconductor with an additive having a specific equilibrium segregation coefficient in a specific amount and rotating the crucible containing the melt at a relatively high velocity. This inventive method is so effective that a substantially dislocation-free single crystal of a compound semiconductor such as gallium arsenide, gallium phosphide, gallium arsenide phosphide, indium arsenide, indium phosphide, indium antimonide and the like can be easily obtained even when the velocity of single crystal growing is 1.0 mm/hour or higher.

In the investigations leading to the establishment of the above described inventive method, the inventors have conducted a theoretical study to find the conditions for preventing the phenomenon of cellular growth in the single crystal under growing even when the concentration of the above mentioned additive is high in the melt and arrived at a conclusion that the above mentioned object can be achieved only when the process of single crystal growing is performed under conditions to satisfy the equation:

$$K_{eff} \cdot m \cdot [(1-K_o)/K_o](V/D) \cdot C(\infty) \leq G, \qquad (I)$$

in which
$K_{eff} = K_o/[K_o + (1-K_o)e^{-(V\delta/D)}]$;
m is the gradient of the liquidus line determined by the phase diagram;
V is the growth rate of the crystal under pulling up;
δ is the thickness of the diffusion boundary layer at the interface between the growing single crystal and the melt, which is determined by the rotating velocities of the crucible and the seed;
D is the diffusion coefficient of the additive within the diffusion layer;
$C(\infty)$ is the concentration of the additive in the melt at a spot sufficiently remote from the interface;

G is the temperature gradient in the melt at the interface;

$K_o$ is the equilibrium segregation coefficient of the additive; and $K_{eff}$ is the effective segregation coefficient of the additive.

When the process of the liquid-encapsulated Czochralski single crystal growing is performed, the solidified fraction of the growing single crystal is increased consequently to increase the concentration $C(\infty)$ of the additive in the melt and the equation (I) is no longer held. Although the equation (I) can again be held by decreasing the pulling rate, i.e. the growth rate V, consequently to decrease the left-hand term of the equation, this is not a practical way due to the decrease in the productivity. Of course, an alternative advantageous way to decrease the effective segregation coefficient $K_{eff}$ is to decrease the thickness of the boundary diffusion layer δ as not to affect the productivity. Since the thickness of the boundary diffusion layer δ is determined by the rotating velocities of the crucible and the seed, the inventors have repeated extensive experiments to discover that quite satisfactory results can be obtained when the crucible is rotated at a velocity of 40 rpm or higher, which is much higher than the conventional velocity of 20 to 30 rpm, leading to the completion of the present invention, the scope of which is as described above.

This method of the present invention is so effective that the single crystal of a compound semiconductor grown by the method may have an extremely high quality without cellular growth containing dislocations in a density of 1000 or smaller per cm$^2$.

An alternative effective means to decrease the thickness of the boundary diffusion layer δ is to increase the rotating velocity of the seed crystal. In this regard, the rotating velocity of the seed crystal in the inventive method should be at least 10 rpm or, preferably, in the range from 20 to 30 rpm.

The growth rate V of the single crystal in the inventive method can be higher than in the conventional methods without affecting the quality of the single crystal. For example, single crystals of quite satisfactory quality can be obtained up to 70% of the solidified fraction or higher even when the velocity of crystal pulling up is 1.0 mm/hour or higher.

The additive to the melt in the inventive method should have an equilibrium segregation coefficient $K_o$ smaller than 1 and is selected from the group consisting of indium, aluminum and antimony when a single crystal of gallium arsenide is desired. Although the advantage obtained by the method of the present invention is the most remarkable for the liquid-encapsulated Czochralski single crystal growing of gallium arsenide single crystals by using indium as the additive to the melt, the inventive method is also applicable to the preparation of single crystals of gallium phosphide, gallium arsenide phosphide, indium arsenide, indium phosphide, indium antimonide and the like by properly selecting the additive to the melt.

In the following, the method of the present invention is described in more detail by way of examples.

EXAMPLE 1

A melt of gallium arsenide was admixed with indium at a concentration of $1.0 \times 10^{21}$ atoms/cm$^3$ and the liquid-encapsulated Czochralski single crystal growing was performed up to 85% of the solidified fraction at a pulling-up velocity of 5 mm/hour with the crucible rotated at a velocity of 40 rpm. The quality of the thus grown single crystal was quite satisfactory up to 83% or more of solidification with no cellular growth containing dislocations in a density of only 200 or smaller per cm$^2$.

When the same procedure as above was repeated except that the crucible was rotated at a velocity of 30 rpm, beginning of cellular growth was noted at about 68% of solidification.

EXAMPLE 2

A melt of gallium arsenide was admixed with indium in a concentration of $2.5 \times 10^{21}$ atoms/cm$^3$ and the liquid-encapsulated Czochralski single crystal growing was performed up to 82% solidification at a pulling-up velocity of 2 mm/hour with the crucible rotated at a velocity of 70 rpm. The quality of the thus grown single crystal was quite satisfactory with no cellular growth containing dislocations at a density of only 200 or smaller per cm$^2$.

When the same crystal growing procedure as above was repeated except that the crucible was rotated at a velocity of 30, 40 or 60 rpm, beginning of cellular growth was noted at about 60%, 70% or 78%, respectively, of solidification. When the velocity of crucible rotation was 30 rpm, in particular, the grown crystal was polycrystalline after about 65% solidification to give a conclusion that single crystals of high quality could not be obtained in a high yield under the crystal growing conditions.

EXAMPLE 3

A melt of gallium phosphide was admixed with indium at a concentration of $2.0 \times 10^{21}$ atoms/cm$^3$ and the liquid-encapsulated Czochralski single crystal growing was performed at a pulling-up velocity of 2.5 mm/hour with the crucible rotated at a velocity of 70 rpm. The quality of the thus grown single crystal of gallium phosphide was quite satisfactory up to 76% solidification without cellular growth.

What is claimed is:

1. In a liquid-encapsulated Czochralski single crystal growing method for the preparation of a substantially dislocation-free single crystal of a compound semi-conductor wherein the crystal is formed by pulling up the crystal from a melt of the semi-conductor compound, the improvement which comprises admixing the melt with an additive having an equilibrium segregation coefficient $K_o$ smaller than 1.0 in an amount such that the concentration of the additive in the melt is at least $1.0 \times 10^{21}$ atoms/cm$^3$ and rotating the crucible containing the melt at a velocity of at least 40 rpm, while pulling up the compound at a velocity of at least 1.0 mm/hour.

2. In a liquid-encapsulated Czochralski single crystal growing method for the preparation of a single crystal of gallium arsenide compound semiconductor by pulling up the crystal from a melt of gallium arsenide, the improvement which comprises admixing the melt of gallium arsenide with indium in an amount such that the concentration of indium in the melt is at least $1.0 \times 10^{21}$ atoms/cm$^3$ and rotating the crucible containing the melt of gallium arsenide at a velocity of at least 40 rpm, while using a pulling-up velocity of at least 1.0 mm/hour.

* * * * *